(12) United States Patent
Kim et al.

(10) Patent No.: US 11,772,198 B2
(45) Date of Patent: Oct. 3, 2023

(54) APPARATUS INCLUDING LASER HEATING FOR ETCHING THIN LAYER

(71) Applicant: SEMES CO., LTD., Cheonan-si (KR)

(72) Inventors: Won Geun Kim, Goyang-si (KR); Tae Shin Kim, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 373 days.

(21) Appl. No.: 17/115,284

(22) Filed: Dec. 8, 2020

(65) Prior Publication Data

US 2021/0178522 A1  Jun. 17, 2021

(30) Foreign Application Priority Data

Dec. 13, 2019 (KR) .................. 10-2019-0166795

(51) Int. Cl.
  *B23K 26/362* (2014.01)
  *H01L 21/263* (2006.01)
  *B23K 101/40* (2006.01)

(52) U.S. Cl.
  CPC ........ *B23K 26/362* (2013.01); *H01L 21/2633* (2013.01); *B23K 2101/40* (2018.08)

(58) Field of Classification Search
  CPC ......... H01L 21/67115; H01L 21/67248; H01L 21/2633; H01L 21/6708; H01L 21/67075; H01L 21/68764; B23K 26/362; B23K 2101/40; B23K 2103/56; B23K 26/034; B23K 26/0604; B23K 26/0626; B23K 26/0734; B23K 26/402; H01S 3/10; H01S 3/23
  See application file for complete search history.

(56) References Cited

U.S. PATENT DOCUMENTS

2020/0335361 A1\* 10/2020 Jang .................. H01L 21/68792

FOREIGN PATENT DOCUMENTS

| JP | 11-219899 | 8/1999 |
|---|---|---|
| JP | 2010-80918 | 4/2010 |
| JP | 2014-157935 | 8/2014 |
| JP | 2015-92526 | 5/2015 |
| JP | 2015092526 A | \* 5/2015 |
| JP | 2019-121710 | 7/2019 |

OTHER PUBLICATIONS

Japanese Office Action with English translation for Japanese Patent Application No. 2020-198339, dated Sep. 6, 2022.

\* cited by examiner

*Primary Examiner* — John P. Dulka
(74) *Attorney, Agent, or Firm* — KILE PARK REED & HOUTTEMAN PLLC

(57) ABSTRACT

A thin layer etching apparatus includes an etchant supply unit configured to supply an etchant onto a substrate to etch a thin layer formed on the substrate, a temperature measuring unit configured to measure a temperature of the substrate while an etching process is performed by the etchant, a laser irradiating unit configured to irradiate a first laser beam on a first portion including a central portion of the substrate and to irradiate a second laser beam in a ring shape on a second portion surrounding the first portion so that the temperature of the substrate is maintained at a predetermined temperature during the etching process, and a process control unit configured to control power of the first and second laser beams based on the temperature of the substrate measured by the temperature measuring unit to reduce a temperature difference between the first and second portions of the substrate.

18 Claims, 2 Drawing Sheets

(a)　(b)　(c)　(d)　(e)

APPARATUS INCLUDING LASER HEATING FOR ETCHING THIN LAYER

CROSS-REFERENCE TO RELATED APPLICATION

This application claims the priority benefit of Korean Patent Application No. 10-2019-0166795, filed on Dec. 13, 2019, and all the benefits accruing therefrom under U.S.C. § 119, the contents of which are incorporated by reference in their entirety.

TECHNICAL FIELD

The present disclosure relates to an apparatus for etching a thin layer. More particularly, the present disclosure relates to an apparatus for etching and removing a thin layer formed on a substrate such as s silicon wafer.

BACKGROUND

Generally, semiconductor devices may be manufactured by manufacturing processes repeatedly performed on a silicon wafer. For example, a deposition process for forming a thin layer on a substrate, a photolithography process for forming a photoresist pattern on the thin layer, an etching process for patterning or removing the thin layer, etc., may be performed.

The etching process is classified into a dry etching process and a wet etching process. The wet etching process is classified into a single wafer type configured to process substrates piece by piece and a batch type configured to simultaneously process substrates. In a single wafer type etching apparatus, etchant is supplied on a rotating substrate, and the thin layer is removed through a reaction between the thin layer and the etchant. Etch residues and remaining etchant produced by the reaction is removed by the rotation of the substrate.

For example, when a thin layer including silicon nitride is formed on the substrate, the thin layer may be removed by etchant including phosphoric acid and water. In order to increase the speed of the reaction between the silicon nitride and the etchant, the etchant is heated and is then supplied on a central portion of the substrate. The etchant spreads from the central portion of the substrate toward an edge portion of the substrate by the rotation of the substrate. However, the temperature of the etchant may be lowered during the spreading, and thus, the etch rate may be decreased from the central portion of the substrate toward the edge portion of the substrate. Therefore, the thin layer on the substrate may not be uniformly removed.

SUMMARY

The embodiments of the present invention provide an apparatus for uniformly etching a thin layer on a substrate.

In accordance with an aspect of the present invention, an apparatus for etching a thin layer may include an etchant supply unit configured to supply an etchant onto a substrate to etch a thin layer formed on the substrate, a temperature measuring unit configured to measure a temperature of the substrate while an etching process is performed by the etchant, a laser irradiating unit configured to irradiate a first laser beam on a first portion including a central portion of the substrate and to irradiate a second laser beam in a ring shape on a second portion surrounding the first portion so that the temperature of the substrate is maintained at a predetermined temperature during the etching process, and a process control unit configured to control power of the first and second laser beams based on the temperature of the substrate measured by the temperature measuring unit to reduce a temperature difference between the first and second portions of the substrate.

In accordance with some embodiments of the present invention, the etchant supply unit may include an etchant supply nozzle configured to supply the etchant on the central portion of the substrate, a nozzle driving part configured to move the etchant supply nozzle in a horizontal direction, and an etchant heating part configured to heat the etchant at a predetermined temperature.

In accordance with some embodiments of the present invention, the laser irradiating unit may be disposed above the central portion of the substrate, and the etchant supply nozzle may be moved between the substrate and the laser irradiating unit by the nozzle driving part in the horizontal direction.

In accordance with some embodiments of the present invention, the etchant supply nozzle may be moved in the horizontal direction to be spaced apart from the substrate after the etchant is supplied in a predetermined amount on the central portion of the substrate.

In accordance with some embodiments of the present invention, the thin layer may include silicon nitride, and the etchant may include phosphoric acid and water.

In accordance with some embodiments of the present invention, the apparatus may further include a rotation driving unit configured to rotate the substrate. In such case, the etchant supply unit may supply the etchant in a predetermined amount on the central portion of the substrate, and the rotation driving unit may rotate the substrate so that the etchant spreads entirely on an upper surface of the substrate to form a liquid layer having a predetermined thickness.

In accordance with some embodiments of the present invention, the rotation driving unit may stop the rotation of the substrate so that the liquid layer is maintained by a surface tension.

In accordance with some embodiments of the present invention, the apparatus may further include a bowl unit configured to surround the substrate to collect the etchant.

In accordance with some embodiments of the present invention, the apparatus may further include a support unit configured to support the substrate, and the rotation driving unit may rotate the support unit.

In accordance with some embodiments of the present invention, the temperature measuring unit may include a thermal imaging camera disposed above the substrate.

In accordance with some embodiments of the present invention, the temperature measuring unit may include a plurality of infrared temperature sensors disposed under the substrate.

In accordance with some embodiments of the present invention, the apparatus may further include a support unit configured to support the substrate. In such case, the support unit may include a support head having a circular plate shape and support pins disposed on the support head to support edge portions of the substrate, and the infrared temperature sensors may be disposed on the support head.

In accordance with some embodiments of the present invention, the laser irradiating unit may include an adjustable ring mode (ARM) fiber laser device capable of controlling the power of the first and second laser beams.

In accordance with some embodiments of the present invention, the apparatus may further include an infrared heater configured to heat the substrate.

In accordance with some embodiments of the present invention, the temperature measuring unit may include a thermal imaging camera disposed above the substrate, and the infrared heater may be disposed under the substrate.

In accordance with some embodiments of the present invention, the apparatus may further include a support unit configured to support the substrate. In such case, the support unit may include a support head having a circular plate shape and support pins disposed on the support head to support edge portions of the substrate, and the infrared heater may include a plurality of infrared lamps disposed on the support head.

In accordance with some embodiments of the present invention, a plurality of recesses may be formed in upper surface portions of the support head, the infrared lamps may be disposed in the recesses, and a plurality of windows may be disposed above the infrared lamps to cover upper portions of the recesses.

In accordance with some embodiments of the present invention, the temperature measuring unit may include a plurality of infrared temperature sensors disposed under the substrate, and the infrared heater may be disposed above the substrate. In such case, the apparatus may further include a support unit configured to support the substrate. The support unit may include a support head having a circular plate shape and support pins disposed on the support head to support edge portions of the substrate, and the infrared temperature sensors may be disposed on the support head.

The above summary of the invention is not intended to describe each illustrated embodiment or every implementation of the present invention. The detailed description and claims that follow more particularly exemplify these embodiments.

BRIEF DESCRIPTION OF THE DRAWINGS

Embodiments of the present invention can be understood in more detail from the following description taken in conjunction with the accompanying drawings, in which.

Figure 1:
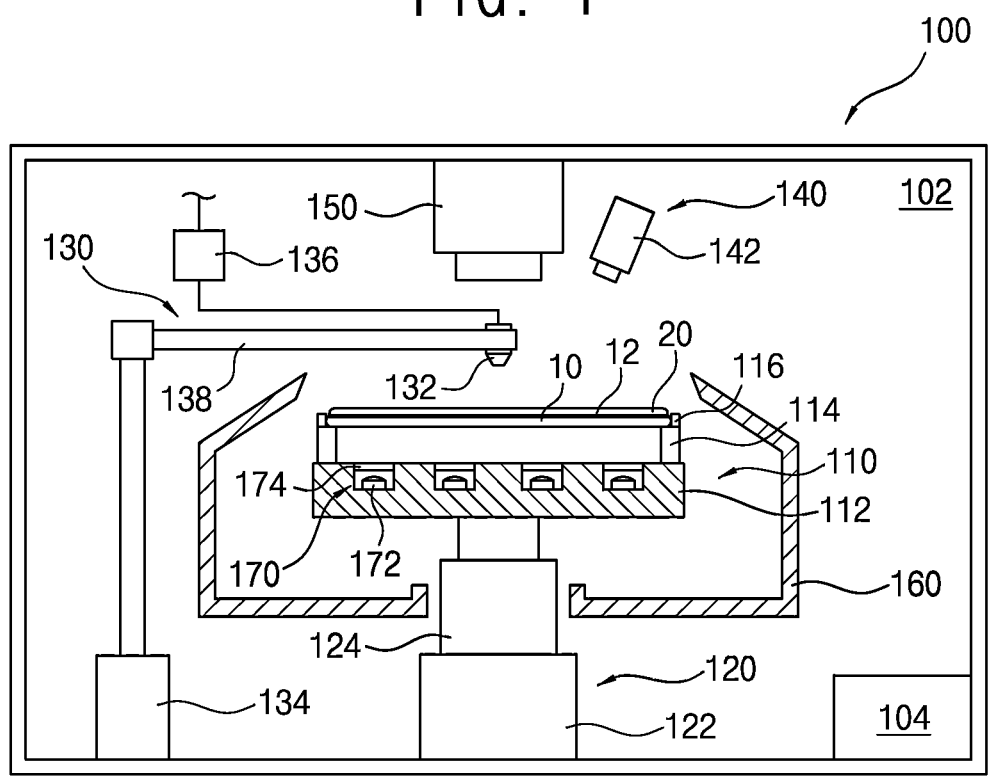
FIG. 1 is a schematic view illustrating an apparatus for etching a thin layer in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
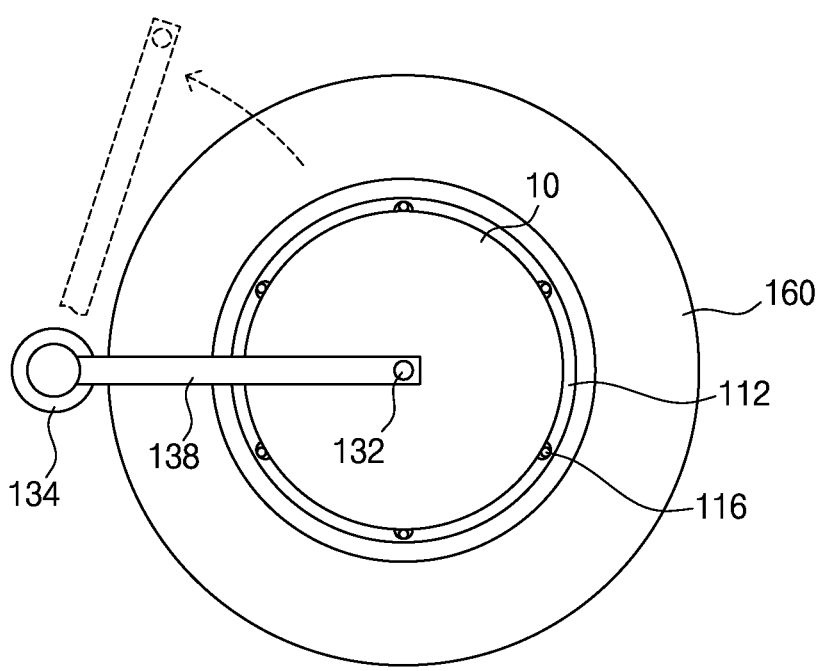
FIG. 2 is a plan view illustrating an etchant supply unit as shown in FIG. 1.

FIG. 1 is a schematic view illustrating an apparatus for etching a thin layer in accordance with an embodiment of the present invention, and FIG. 2 is a plan view illustrating an etchant supply unit as shown in FIG. 1.

Referring to FIGS. 1 and 2, an apparatus 100 for etching a thin layer may be used to remove a thin layer 12 formed on a substrate 10 such as a silicon wafer during a semiconductor manufacturing process. For example, the thin layer 12 including silicon nitride ($Si_3N_4$) may be formed on the substrate 10, and the thin layer etching apparatus 100 may supply an etchant 20 including phosphoric acid ($H_3PO_4$) and water ($H_2O$) on the substrate 10, and may remove the thin layer 12 using etching reaction between the thin layer 12 and the etchant 20.

In accordance with an embodiment of the present invention, the thin layer etching apparatus 100 may include a process chamber 102, in which an etching process for removing the thin layer 12 is performed, and a support unit 110 configured to support the substrate 10 and a rotation driving unit 120 configured to rotate the support unit 110 may be disposed in the process chamber 102.

For example, the support unit 110 may include a support head 112 having a circular plate shape and a plurality of support pins 114 disposed on the support head 112 to support edge portions of the substrate 10. The support pins 114 may be arranged in a circular ring shape to support the edge portions of the substrate 10. A plurality of support members 116 configured to support side portions of the substrate 10 may be respectively disposed on the support pins 114 during the rotation of the substrate 10. The rotation driving unit 120 may include a rotation driving part 122 disposed under the support head 112 and including a motor for providing a rotational force and a rotating shaft 124 connecting the rotation driving part 122 to the support head 112.

The thin layer etching apparatus 100 may include an etchant supply unit 130 configured to supply etchant 20 onto the substrate 10 to etch the thin layer 12. For example, the etchant supply unit 130 may include an etchant supply nozzle 132 configured to supply the etchant 20 on a central portion of the substrate, a nozzle driving part 134 configured to move the etchant supply nozzle 132 in a horizontal direction, and an etchant heating part 136 configured to heat the etchant 20 at a predetermined temperature.

Meanwhile, the thin layer 12 including the silicon nitride may be removed by a chemical reaction between the silicon nitride and the etchant 20 including phosphoric acid and water. Reaction formula between the thin layer 12 and the etchant 20 is as follows.

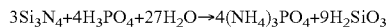

$$3Si_3N_4 + 4H_3PO_4 + 27H_2O \rightarrow 4(NH_4)_3PO_4 + 9H_2SiO_3$$

In the above reaction, a reaction speed may be increased by a temperature of the etchant 20, and the etchant heating part 136, for example, may heat the etchant 20 at a temperature of about 150° C., which is lower than a boiling point of the etchant 20, in order to increase an etch rate of the thin layer 12.

In accordance with an embodiment of the present invention, the etching process on the thin layer 12 may be performed in a puddle method. In particular, the etchant supply unit 130 may supply the etchant 20 in a predetermined amount on a central portion of the substrate 10, and the rotation driving unit 120 may rotate the substrate 10 at a low speed to entirely spread the etchant 20 on an upper surface of the substrate 10 to form a liquid layer having a predetermined thickness thereon. That is, the etchant 20 supplied on the substrate 10 may spread from the central portion of the substrate 10 toward an edge portion of the substrate 10 by a centrifugal force, and the rotation driving unit 120 may stop the rotation of the substrate 10 after the etchant 20 sufficiently spreads towards the edge portion of the substrate 10. The liquid layer may be maintained by a surface tension of the etchant 20, and the etching process on the thin layer 12 may be performed for a predetermined time after the liquid layer is formed.

The temperature of the etchant 20 may be changed during the etchant 20 supplied on the substrate 10 spreads from the central portion of the substrate 10 toward the edge portion of the substrate 10, and the etch rate of the thin layer 12 may thus be different for each portion of the substrate 10. In accordance with an embodiment of the present invention, in order to solve the above described problem, the thin layer etching apparatus 100 may include a temperature measuring unit 140, a laser irradiating unit 150, and a process control unit 104. The temperature measuring unit 140 is configured to measure the temperature of the substrate 10 during the etching process performed by the etchant 20. In order to maintain the temperature of the substrate 10 at a predetermined temperature during the etching process, the laser irradiating unit 150 may irradiate a first laser beam 30 (shown in FIG. 3) onto a first portion including the central portion of the substrate 10 and irradiate a second laser beam 32 (shown in FIG. 3) having a ring shape onto a second portion surrounding the first portion. The process control unit 104 may control a power of the first laser beam 30 and a power of the second laser beam 32 based on the temperature measured by the temperature measuring unit 140 to reduce a temperature difference between the first and second portions of the substrate 10.

For example, the temperature measuring unit 140 may include a thermal imaging camera 142 disposed above the substrate 10, and the process control unit 104 may detect a temperature of the first portion of the substrate 10 and a temperature of the second portion surrounding the first portion from an image acquired by the thermal imaging camera 142.

The laser irradiating unit 150 may be disposed above the central portion of the substrate 10, and may provide the first laser beam 30 having a circular beam pattern corresponding to the first portion of the substrate 10 and a second laser beam 32 having a circular ring-shaped beam pattern corresponding to the second portion. For example, the laser irradiating unit 150 may include an adjustable ring mode (ARM) fiber laser device, which may control powers of the first laser beam 30 and the second laser beam 32.

Figure 3:
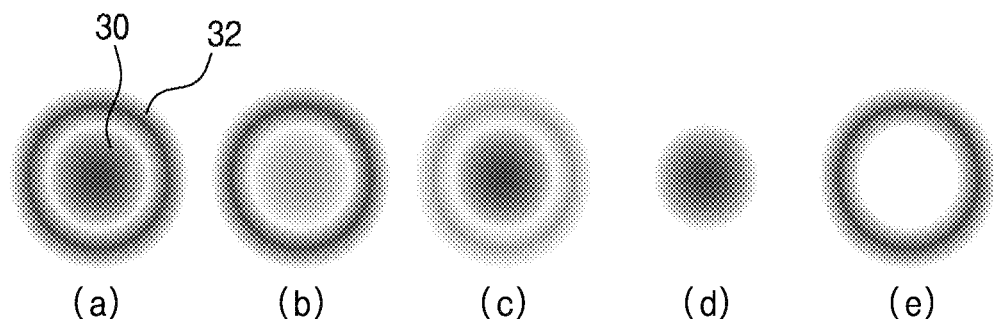
FIG. 3 is an image illustrating a first laser beam and a second laser beam irradiated from a laser irradiating unit as shown in FIG. 1.

FIG. 3 is an image illustrating a first laser beam and a second laser beam irradiated from a laser irradiating unit as shown in FIG. 1.

Referring to FIG. 3, the process control unit 104 may control the power of the first laser beam 30 and the power of the second laser beam 32 based on the temperature of the substrate 10. For example, the process control unit 104 may control the first laser beam 30 to have the same power as the second laser beam 32 as shown in FIG. 3(a), or may selectively provide the first laser beam 30 or the second laser beam 32 as shown in FIGS. 3(d) and 3(e). Further, when the first portion and the second portion of the substrate 10 have different temperatures from each other, the second laser beam 32 may have a power greater than the first laser beam 30 as shown in FIG. 3(b), or the first laser beam 30 may have a power greater than the second laser beam 32 as shown in FIG. 3(c).

As described above, the power of the first laser beam 30 and the power of the second laser beam 32 are controlled based on the temperature of the first and second portions of the substrate 10, and thus the temperature of the substrate 10 may be uniformly controlled at a predetermined temperature. Thus, the etch rate of the thin layer 12 may be uniformly controlled at the entire of the substrate 10.

Referring again to FIGS. 1 and 2, the etchant supply nozzle 132 may be disposed under the laser irradiating unit 150. That is, the etchant supply nozzle 132 may be moved in a horizontal direction between the substrate 10 and the laser irradiating unit 150 by the nozzle driving part 134. For example, the nozzle driving part 134 may be connected to the etchant supply nozzle 132 through a nozzle arm 138, and may rotate the nozzle arm 138 so that the etchant supply nozzle 132 is disposed above the central portion of the substrate. Also, the nozzle driving part 134 may rotate the nozzle arm 138 so that the etchant supply nozzle 132 is spaced apart from the substrate 10 after the etchant 20 is supplied on the substrate 10.

In accordance with an embodiment of the present invention, the thin layer etching apparatus 100 may include a bowl unit 160 configured to surround the substrate 10 to collect the etchant 20. For example, in order to remove reaction by-products and remaining etchant from the substrate 10 after the etching process, the rotation driving unit 120 may rotate the substrate 10 at a high speed, and the reaction by-products and the remaining etchant may be removed from the substrate 10. The reaction by-products and the remaining etchant removed from the substrate 10 may be collected by the bowl unit 160, and may be discharged through a discharge pipe (not shown) connected to the bowl unit 160.

As shown in FIG. 1, the bowl unit 160 includes one bowl. However, as another example, the bowl unit 160 may include a plurality of bowls. For example, after the etching process is performed, a rinsing process for removing etch residues from the substrate 10 and a drying process for drying the substrate 10 may be performed. Also, the bowl unit 160 may further include a second bowl (not shown) configured to collect a rinsing liquid such as deionized water used for the rinsing process and a third bowl (not shown) configured to collect a drying liquid such as isopropyl alcohol used for the drying process. Also, although not shown in the figures, the thin layer etching apparatus 100 may further include a rinsing liquid supply unit configured to supply the rinsing liquid and a drying liquid supply unit configured to supply the drying liquid.

Meanwhile, in accordance with an embodiment of the present invention, the thin layer etching apparatus 100 may include an infrared heater 170 configured to heat the substrate 10 at a predetermined temperature. The infrared heater 170 may be disposed under the substrate 10 and may include a plurality of infrared lamps 172 disposed on the support head 112. For example, the infrared heater 170 may include a plurality of infrared lamps 172 disposed in the support head 112, and the support head 112 may include a plurality of quartz windows 174 configured to transmit infrared lights irradiated from the infrared lamps 172 towards a lower surface of the substrate 10. Specifically, a plurality of recesses may be formed in upper surface portions of the support head 112, and the infrared lamps 172 may be disposed in the recesses. In such case, the quartz windows 174 may be disposed above the infrared lamps 172 to cover upper portions of the recesses.

Figure 4:
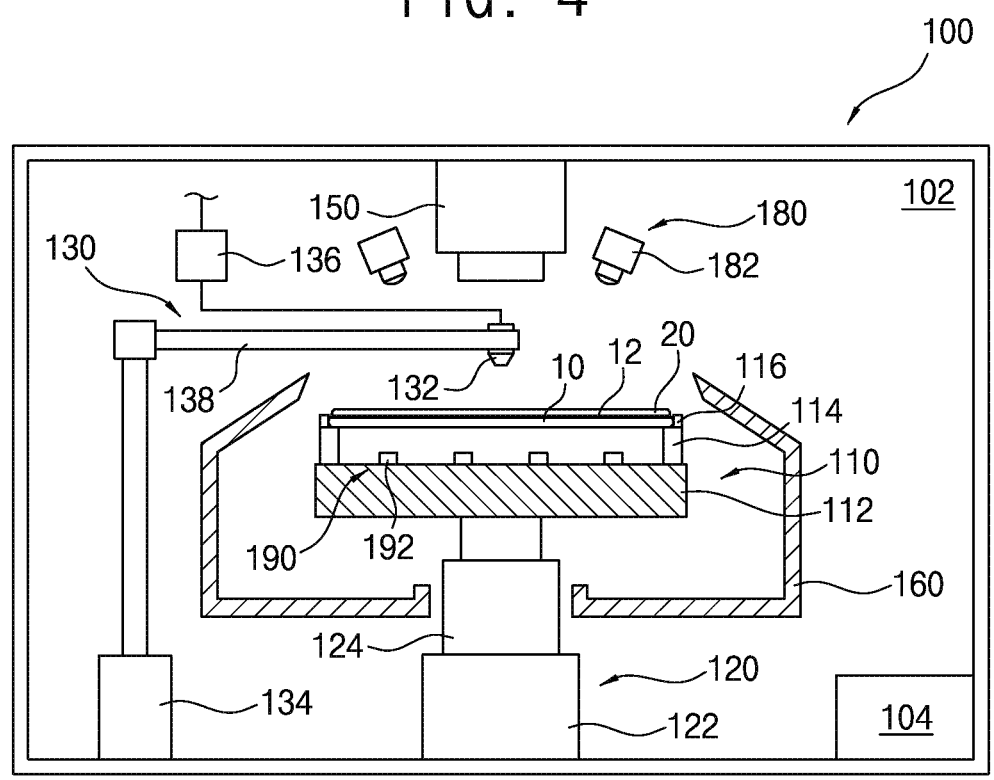
FIG. 4 is a schematic view illustrating an apparatus for etching a thin layer in accordance with another embodiment of the present invention.

FIG. 4 is a schematic view illustrating an apparatus for etching a thin layer in accordance with another embodiment of the present invention.

Referring to FIG. 4, the thin layer etching apparatus 100 may include an infrared heater 180 configured to heat a substrate 10 and a temperature measuring unit 190 configured to measure the temperature of the substrate 10. For example, the infrared heater 180 may include a plurality of infrared lamps 182 disposed above the substrate 10, and the temperature measuring unit 190 may include a plurality of infrared temperature sensors 192 disposed under the substrate 10, for example, on the support head 112.

In accordance with the embodiments of the present invention as described above, the temperature of the first portion of the substrate 10 and the etchant 20 disposed thereon and the temperature of the second portion of the substrate 10 and the etchant 20 disposed thereon may be changed while supplying the etchant 20 on the substrate 10. The difference between the temperature of the first portion and the temperature of the second portion may be reduced by the power control of the first laser beam 30 and the second laser beam 32.

In particular, when the temperature of the second portion is lower than the temperature of the first portion, the power of the second laser beam 32 may be controlled to be greater than the power of the first laser beam 30, and thus, the temperature of the substrate 10 and the etchant 20 may be uniformed. Further, when the temperature of the substrate 10 heated by the infrared heater 170 is higher than the temperature of the etchant 20, the temperature of the first portion may be lower than the temperature of the second portion. In such case, the power of the first laser beam 30 may be controlled to be greater than the power of the second laser beam 32, and thus, the temperature of the substrate 10 and the etchant 20 may be uniformed. As a result, the temperature of the entire substrate 10 and the etchant 20 may be uniformed, and the etch rate of the thin layer 12 may thus be uniformed.

Although the thin layer etching apparatus 100 has been described with reference to specific embodiments, it is not limited thereto. Therefore, it will be readily understood by those skilled in the art that various modifications and changes can be made thereto without departing from the spirit and scope of the present invention defined by the appended claims.

The invention claimed is:

1. An apparatus for etching a thin layer comprising:
an etchant supply unit configured to supply an etchant onto a substrate to etch a thin layer formed on the substrate;
a temperature measuring unit configured to measure a temperature of the substrate while an etching process is performed by the etchant;
a laser irradiating unit configured to irradiate a first laser beam on a first portion including a central portion of the substrate and to irradiate a second laser beam in a ring shape on a second portion surrounding the first portion so that the temperature of the substrate is maintained at a predetermined temperature during the etching process; and
a process control unit configured to control power of the first and second laser beams based on the temperature of the substrate measured by the temperature measuring unit to reduce a temperature difference between the first and second portions of the substrate,
wherein the etchant supply unit comprises an etchant supply nozzle configured to supply the etchant on the central portion of the substrate, a nozzle driving part configured to move the etchant supply nozzle in a horizontal direction, and an etchant heating pan configured to heat the etchant at a predetermined temperature.

2. The apparatus for etching the thin layer of claim 1, wherein the laser irradiating unit is disposed above the central portion of the substrate, and the etchant supply nozzle is moved between the substrate and the laser irradiating unit by the nozzle driving part in the horizontal direction.

3. The apparatus for etching the thin layer of claim 2, wherein the etchant supply nozzle is moved in the horizontal direction to be spaced apart from the substrate after the etchant is supplied in a predetermined amount on the central portion of the substrate.

4. The apparatus for etching the thin layer of claim 1, wherein the thin layer comprises silicon nitride, and the etchant comprises phosphoric acid and water.

5. The apparatus for etching the thin layer of claim 1, further comprising a rotation driving unit configured to rotate the substrate,
wherein the etchant supply unit supplies the etchant in a predetermined amount on the central portion of the substrate, and the rotation driving unit rotates the substrate so that the etchant spreads entirely on an upper surface of the substrate to form a liquid layer having a predetermined thickness.

6. The apparatus for etching the thin layer of claim 5, wherein the rotation driving unit stops the rotation of the substrate so that the liquid layer is maintained by a surface tension.

7. The apparatus for etching the thin layer of claim 5, further comprising a bowl unit configured to surround the substrate to collect the etchant.

8. The apparatus for etching the thin layer of claim 5, further comprising a support unit configured to support the substrate,
wherein the rotation driving unit rotates the support unit.

9. The apparatus for etching the thin layer of claim 1, wherein the temperature measuring unit comprises a thermal imaging camera disposed above the substrate.

10. An apparatus for etching a thin layer comprising:
an etchant supply unit configured to supply an etchant onto a substrate to etch a thin layer formed on the substrate;
a temperature measuring unit configured to measure a temperature of the substrate while an etching process is performed by the etchant;
a laser irradiating unit configured to irradiate a first laser beam on a first portion including a central portion of the substrate and to irradiate a second laser beam in a ring shape on a second portion surrounding the first portion so that the temperature of the substrate is maintained at a predetermined temperature during the etching process; and
a process control unit configured to control power of the first and second laser beams based on the temperature of the substrate measured by the temperature measuring unit to reduce a temperature difference between the first and second portions of the substrate,
wherein the temperature measuring unit comprises a plurality of infrared temperature sensors disposed under the substrate.

11. The apparatus for etching the thin layer of claim 10, further comprising a support unit configured to support the substrate,
wherein the support unit comprises a support head having a circular plate shape and support pins disposed on the support head to support edge portions of the substrate, and the infrared temperature sensors are disposed on the support head.

12. An apparatus for etching a thin layer comprising:
an etchant supply unit configured to supply an etchant onto a substrate to etch a thin layer formed on the substrate;
a temperature measuring unit configured to measure a temperature of the substrate while an etching process is performed by the etchant;
a laser irradiating unit configured to irradiate a first laser beam on a first portion including a central portion of the substrate and to irradiate a second laser beam in a ring shape on a second portion surrounding the first portion so that the temperature of the substrate is maintained at a predetermined temperature during the etching process; and
a process control unit configured to control power of the first and second laser beams based on the temperature of the substrate measured by the temperature measuring unit to reduce a temperature difference between the first and second portions of the substrate,
wherein the laser irradiating unit comprises an adjustable ring mode (ARM) fiber laser device capable of controlling the power of the first and second laser beams.

13. An apparatus for etching a thin layer comprising:
an etchant supply unit configured to supply an etchant onto a substrate to etch a thin layer formed on the substrate;
a temperature measuring unit configured to measure a temperature of the substrate while an etching process is performed by the etchant;
a laser irradiating unit configured to irradiate a first laser beam on a first portion including a central portion of the substrate and to irradiate a second laser beam in a ring shape on a second portion surrounding the first portion so that the temperature of the substrate is maintained at a predetermined temperature during the etching process;
a process control unit configured to control power of the first and second laser beams based on the temperature of the substrate measured by the temperature measuring unit to reduce a temperature difference between the first and second portions of the substrate; and
an infrared heater configured to heat the substrate.

14. The apparatus for etching the thin layer of claim 13, wherein the temperature measuring unit comprises a thermal imaging camera disposed above the substrate, and the infrared heater is disposed under the substrate.

15. The apparatus for etching the thin layer of claim 14, further comprising a support unit configured to support the substrate,
wherein the support unit comprises a support head having a circular plate shape and support pins disposed on the support head to support edge portions of the substrate, and the infrared heater comprises a plurality of infrared lamps disposed on the support head.

16. The apparatus for etching the thin layer of claim 15, wherein a plurality of recesses is formed in upper surface portions of the support head, the infrared lamps are disposed in the recesses, and a plurality of windows is disposed above the infrared lamps to cover upper portions of the recesses.

17. The apparatus for etching the thin layer of claim 13, wherein the temperature measuring unit comprises a plurality of infrared temperature sensors disposed under the substrate, and the infrared heater is disposed above the substrate.

18. The apparatus for etching the thin layer of claim 17, further comprising a support unit configured to support the substrate,
wherein the support unit comprises a support head having a circular plate shape and support pins disposed on the support head to support edge portions of the substrate, and the infrared temperature sensors are disposed on the support head.

* * * * *